United States Patent
Gerbl et al.

(10) Patent No.: US 10,732,213 B2
(45) Date of Patent: Aug. 4, 2020

(54) METHOD FOR MEASURING BEAM STEERING CHARACTERISTICS AND MEASUREMENT SYSTEM

(71) Applicant: Rohde & Schwarz GmbH & Co. KG, Munich (DE)

(72) Inventors: Florian Gerbl, Olching (DE); Chlodwig Neuhaeusler, Woerthsee (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 139 days.

(21) Appl. No.: 15/676,718

(22) Filed: Aug. 14, 2017

(65) Prior Publication Data
US 2019/0049502 A1 Feb. 14, 2019

(51) Int. Cl.
*G01R 29/10* (2006.01)
*H01Q 3/26* (2006.01)
*G01R 35/00* (2006.01)

(52) U.S. Cl.
CPC ........... *G01R 29/10* (2013.01); *G01R 35/007* (2013.01); *H01Q 3/267* (2013.01)

(58) Field of Classification Search
CPC ....... G01R 29/10; G01R 35/007; H01Q 3/267
USPC ........................................ 342/368, 174, 360
See application file for complete search history.

(56) References Cited

U.S. PATENT DOCUMENTS

| | | | | |
|---|---|---|---|---|
| 5,559,519 A | * | 9/1996 | Fenner | G01S 7/032 342/157 |
| 6,636,173 B2 | * | 10/2003 | Graham | G01R 29/10 342/174 |
| 8,225,152 B2 | | 7/2012 | Sutton | |
| 2013/0262015 A1 | * | 10/2013 | White | G05B 15/02 702/108 |
| 2013/0262016 A1 | | 10/2013 | White et al. | |

* cited by examiner

*Primary Examiner* — Bo Fan
(74) *Attorney, Agent, or Firm* — Christensen O'Connor Johnson Kindness PLLC

(57) ABSTRACT

A method for measuring beam steering characteristics of a device under test using a measurement system comprising a probe array with at least two field probes. The field probes can be arranged at different angles with respect to the device under test. A reference unit for calibrating the probe array is provided. At least two calibration measurements with different main radiation directions of the reference unit are performed wherein a predefined number of field probes of the probe array is used for measuring the radiation pattern of the reference unit. A calibration dataset for at least each field probe of the predefined number of field probes and each radiation direction is generated and stored. The reference unit is replaced by a device under test such that the device under test is located at the same measurement position as the reference unit was during the calibration measurements. A measurement of the device under test is performed by using the predefined number of field probes of the probe array.

14 Claims, 3 Drawing Sheets

METHOD FOR MEASURING BEAM STEERING CHARACTERISTICS AND MEASUREMENT SYSTEM

FIELD OF THE DISCLOSURE

Embodiments of the present disclosure relate generally to a method for measuring beam steering characteristics of a device under test as well as a measurement system for measuring beam steering characteristics of a device under test.

BACKGROUND

In the state of the art, the antenna characteristics of a device under test such as beam steering characteristics are typically measured by using a reference device under test as well as a measurement antenna that is located at a certain distance with respect to the reference device under test. Then, two different measurements are performed wherein the angularity between the reference device under test and the measurement antenna are varied such that at least two different angles are used for the measurements. Then, the measurement results, in particular the beam steering characteristics, are calculated based on the antenna characteristics of the reference device under test which were obtained during the at least two measurements.

However, this method and measurement system comprises some sources of error which might impair the determination of the antenna characteristics of the device under test.

SUMMARY

Accordingly, there is a need for a method for measuring beam steering characteristics of a device under test as well as a measurement system that ensure a simple and accurate measurement of the beam steering characteristics of a device under test. Embodiments of the present disclosure aim to address this need and/or others.

Embodiments of the present disclosure provide a method for measuring beam steering characteristics of a device under test using a measurement system comprising a probe array with at least two field probes. The field probes are arranged in some embodiments at different angles with respect to the device under test. The method includes the following steps:

providing a reference unit for calibrating the probe array;

performing at least two calibration measurements with different main radiation directions of the reference unit wherein a predefined number of field probes of the probe array is used for measuring the radiation pattern of the reference unit;

generating a calibration dataset for at least each field probe of the predefined number of field probes and each radiation direction;

storing the calibration datasets;

replacing the reference unit by the device under test such that the device under test is located at the same measurement position as the reference unit was during the calibration measurements; and performing a measurement of the device under test by using the predefined number of field probes of the probe array.

Accordingly, the measurement errors can be minimized even though a simple measurement system is used, in particular an arrangement that is easy to set up. The overall measurement is done by using a calibration unit at the beginning that is provided by the reference unit interacting with the probe array. Afterwards, the device under test is positioned at the same measurement location as the reference unit was during the calibration steps such that it is ensured that the distance of the device under test with respect to the probe array (relative position) is exactly the same as the distance between the reference unit and the probe array during the calibration measurements. Therefore, the calibration dataset(s) of the probe array, in particular the ones of the different field probes of the probe array, can be used for characterizing the antenna characteristics of the device under test afterwards as the field probes were calibrated initially. Particularly, the beam direction of the device under test can be determined appropriately.

In some embodiments, during the at least two different calibration measurements, the reference unit is controlled, by, for example, a control and analyzing unit of the measurement system, such that the beam direction of the radiation pattern generated is varied. For instance, the phase of an antenna unit of the reference unit may be controlled appropriately, in particular the phase of an antenna array. Hence, the peak beam of the radiation pattern generated by the reference unit may be directed towards different field probes of the probe array during the different calibration measurements.

According to an aspect, the probe array remains in its position. Thus, the probe array is not moved during the different measurements. In some embodiments, the probe array is located at the same position during all measurements, namely the calibration measurements and the measurement of the device under test. The distance between the probe array and the device under test or rather the reference unit is always the same. Hence, the relative positions are equal during the calibration measurements and the measurement of the device under test.

According to another aspect, the same field probes of the probe array are used for the calibration measurements and the measurement of the device under test. Thus, the calibration datasets determined during the calibration measurement(s) for the predefined number of field probes can be used for the measurement of the device under test.

Generally, the calibration measurements using the reference unit ensures that the field probes of the probe array, which are used for the measurement of the device under test afterwards, are calibrated appropriately.

The calibration measurements and the calibration datasets are used for comparison purposes of the measurement result(s) of the device under test.

Another aspect provides that all field probes of the probe array are used for the calibration measurements and the measurement of the device under test. Thus, all field probes are used in order to improve the sensitivity of the probe array.

Moreover, all calibration datasets generated may be used in some embodiments to determine the main radiation direction of the device under test. Hence, the beam steering characteristics of the device under test can be derived appropriately. The calibration datasets of the predefined number of probe fields can be used. Alternatively, the calibration datasets of all field probes of the probe array may be used ensuring a high sensitivity.

In some embodiments, the main radiation direction of the device under test is calculated. Thus, the measurement result(s) of the measurement of the device under test as well as the calibration datasets generated are taken into account in order to obtain the main radiation direction of the device under test. In some embodiments, the main radiation direction of the device under test is derived by comparing the measurement results of the calibration measurements, and in some embodiments the different calibration datasets, and the measurement of the device under test. The more radiation directions have been measured during the calibration measurements, the simpler the determination of the main radiation direction will be. The same applies for the number of field probes used.

According to an embodiment, the main radiation direction is determined by calculating the smallest error against the calibration datasets generated. Thus, the different deviations from the measurement results obtained during the calibration measurements are calculated by taking the appropriate calibration datasets generated and the actual measurement of the device under test into account, for example, by comparing these data. Then, the main radiation direction of the device under test can be derived appropriately while using the smallest error with regard to the calibration datasets generated before.

Furthermore, the smallest error may be calculated by taking the calibration datasets of the predefined number of field probes into account. Accordingly, the deviations are determined with regard to all calibration datasets available. In some embodiments, the calibration datasets of all probe fields are used for calculating the smallest error in order to obtain the main radiation direction of the device under test in an efficient manner.

For instance, the smallest error is calculated by using at least one of a root means squared error, a mean absolute error, and a mean squared error. Thus, the error can be calculated in an easy manner obtaining good results with regard to its feasibility. Further, other methods can be used for calculating the smallest error.

Furthermore, an interpolation of the measurement results is performed in some embodiments based on the calibration datasets such that at least the second smallest error is also taken into account in order to determine the main radiation direction of the device under test. Further, the third, fourth, fifth and so on smallest error may also be taken into account in order to determine the main radiation direction appropriately. As the smallest error only provides a very good approximation of the main direction, in particular the best one, the other calibration datasets providing the second, third and so on best approximation are used for deriving the main radiation direction. For instance, the main direction is directed towards the surrounding of the field probe providing the calibration dataset with the smallest error. However, the main radiation direction may deviate from the exact position of this field probe. When the second, third and so on smallest errors are also taken into account, it can be derived (interpolated) that the main radiation direction is directed closer to the field probe providing the calibration dataset with the second smallest error than the one providing the calibration dataset with the third smallest error. Thus, the exact main radiation direction can be determined more exactly while taking the errors with higher rank into account.

The interpolation may be performed by taking all calibration datasets of the predefined number of field probes into account. Thus, all data available is used for determining the main radiation direction as exact as possible. Particularly, all field probes and their calibration datasets are used appropriately.

Further, an interpolation of the measurement results is performed in some embodiments based on the calibration datasets of the field probes surrounding the field probe located closest to the main radiation direction determined. When determining the main radiation direction of the device under test in a first approach, a certain field probe can be determined that is deemed to be located the closest to the exact main radiation direction of the device under test, in particular by comparing its calibration dataset appropriately. Once this field probe is determined, the field probes surrounding this field probe can be used in order to evaluate the exact main radiation direction of the device under test in the surrounding of this field probe providing the smallest error. Usually, the surrounding field probes, in particular their calibration datasets, should provide the second, third and so on smallest error as already described above.

Generally, the position of the probe array with respect to the device under test or the reference unit may be defined at least by the azimuth angle and the elevation angle. Thus, the angularity is fixed for the different measurements as the height and in plane angular properties are the same for the different measurements, namely the calibration measurements and the measurement of the device under test, since the (relative) position is the same. Thus, the positions (distances) of the probe array remain the same with respect to the device under test and the reference unit during the dedicated measurements, respectively.

For example, the reference unit is a reference antenna. The reference antenna may correspond to the antenna unit that is used by the device under test, in particular with regard to its structure.

Further, a measurement system for measuring beam steering characteristics of a device under test is provided, that comprises:
a probe array comprising at least two field probes;
a reference antenna used for calibration measurements;
a device under test; and
a control and analyzing unit that is connected with at least one of the probe array, the reference antenna and the device under test, wherein
the measurement system has a measurement location used by the reference antenna and the device under test successively, wherein the control and analyzing unit is configured to control the individual field probes of the probe array such that a predefined number of field probes is activated for measurement purposes, and wherein the control and analyzing unit is configured to control the predefined number of field probes for calibration measurements of the reference antenna and measurements of the device under test successively.

The measurement system can be used to measure the beam steering characteristics of a device under test in an easy manner. Neither the probe array nor the device under test and/or the reference unit is moving during the dedicated measurement.

Further, the control and analyzing unit may be configured to perform a method as mentioned above. The advantages mentioned above apply in a similar manner to the measurement system.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawing, wherein

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
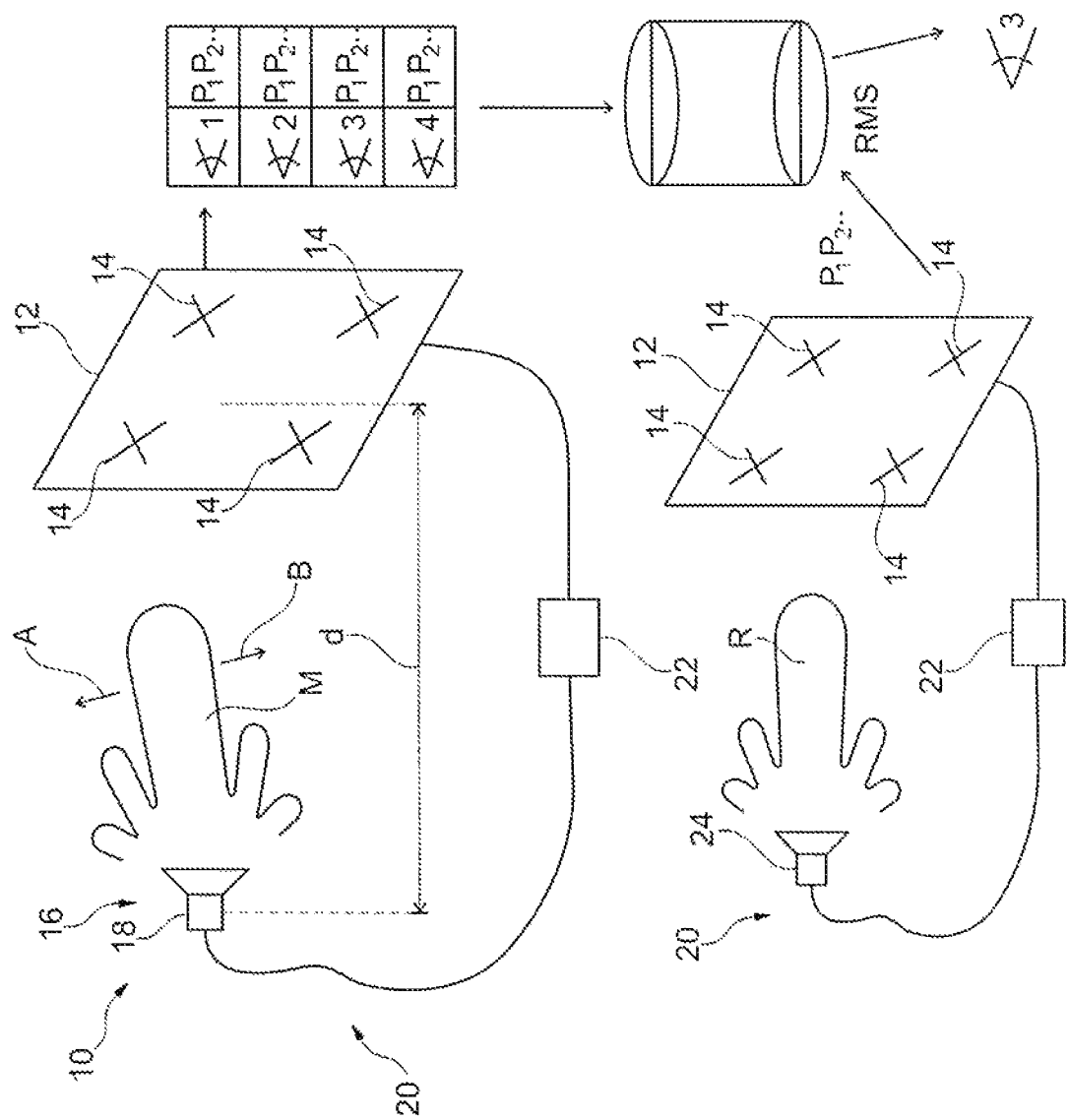
FIG. 1 shows a schematic overview of one representative embodiment of a measurement system according to the disclosure.

In FIG. 1, a representative embodiment of a measurement system 10 for measuring beam steering characteristics of a device under test is shown. As shown in the embodiment of FIG. 1, the measurement system 10 comprises a probe array 12 that has at least two field probes 14 for receiving electromagnetic waves as will be described hereinafter. In the shown embodiment, four different field probes 14 are shown for illustrative purposes. However, the probe array 12 usually has more than four field probes 14. Embodiments of the present disclosure comprise other number of field probes 14.

The measurement system 10 may also comprise a reference unit 16 that is formed by a reference antenna 18. In some embodiments, the reference antenna includes an antenna array. The reference unit 16 is configured to radiate electromagnetic waves that are received by the probe array 12, and in particular, by the individual field probes 14. As shown in FIG. 1, the reference unit 16 is located at a measurement position 20 that has a certain distance d with respect to the probe array 12 (relative position).

The individual field probes 14 of the probe array 12 are located within a frame of the probe array 12 such that they are arranged at different angles with respect to the measurement position 20, in particular the reference unit 16. The angularity can be obtained by arranging the whole probe array 12 under a certain angle with respect to the boresight between the reference unit 16 and the probe array 12 such that a plane of the probe array 12 comprising the individual field probes 14 is inclined under an angle different to 90° with respect to the boresight (sight line). Accordingly, the different field probes 14 of the probe array 12 see the reference unit 16 located at the measurement position 20 under different angles which provides the angularity mentioned above.

Figure 2:
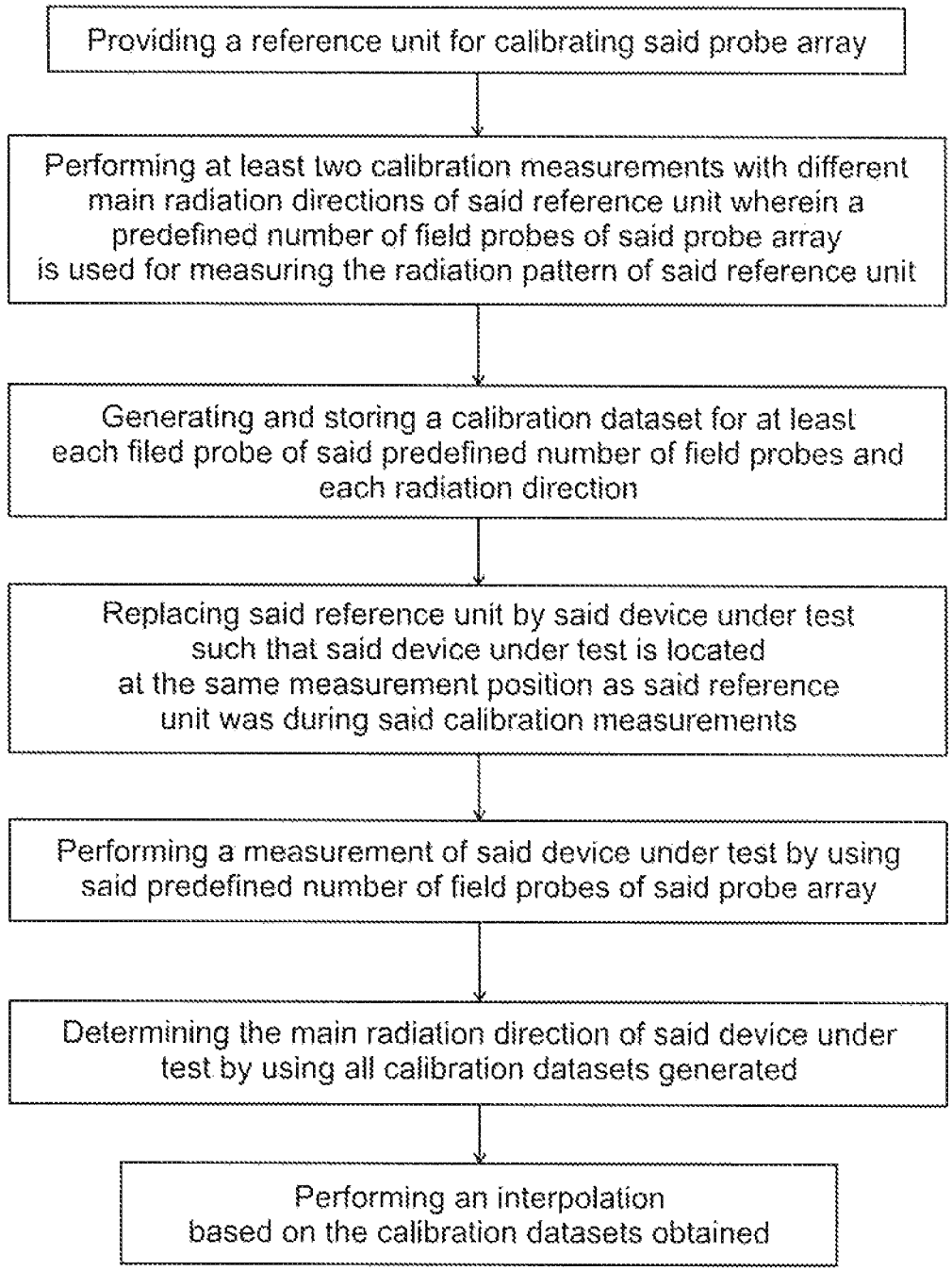
FIG. 2 shows a flow-chart representing one representative embodiment of a method for measuring beam steering characteristics of a device under test.

In some embodiments, the measurement system 10 further comprises a control and analyzing unit 22 that is connected to the probe array 12 as well as the reference unit 16 for performing calibration measurements as will be described hereinafter with reference to FIG. 2 illustrating a flow chart of a method for measuring the beam steering characteristics of a device under test.

The calibration measurements take place by selecting a predefined number of field probes 14 of the probe array 12, for instance N field probes 14 that are used for calibration. For instance, two of the four field probes 14 are selected. Alternatively, all field probes 14 may be selected as shown in the embodiment of FIG. 1.

Then, the control and analyzing unit 22 controls the reference unit 16 such that a radiation pattern is generated.

In some embodiments, an antenna unit of the reference unit 16 is controlled such that the main beam of the radiation pattern is directed towards a first direction. Thus, this first direction corresponds to a first main radiation direction of the reference unit 16. The calibration data for at least each field probe 14 selected is generated and stored appropriately, for instance in a memory allocated to the control and analyzing unit 22. This is illustrated on the right side of FIG. 1 as four calibration data for the four individual field probes 14 are obtained each labeled by p1.

As already mentioned above, at least two field probes 14 are used for the calibration measurements. However, the sensitivity is increased when all field probes 14 are used such that the calibration data are generated and stored for all field probes 14.

Once the calibration data for the first calibration measurement have been generated and stored, at least a second calibration measurement is performed. In this second calibration measurement, the reference unit 16 is controlled such that its radiation pattern has a different main radiation direction with regard to the one during the first calibration measurement.

This means that the control and analyzing unit 22 controls the reference unit 16, in particular its antenna unit, such that the peak beam is directed into another direction, namely a second direction. For instance, the control and analyzing unit 22 controls the phase of an antenna array used as the antenna unit of the reference unit 16.

In FIG. 1, the different main radiation directions of the reference unit 16 are illustrated by the arrows A, B which are depicted close the main lobe M of the radiation pattern of the reference unit 16 wherein the arrows A, B represent the swiveling of the main radiation direction. The direction of the main lobe M defines the main radiation direction of the reference unit 16.

For at least each selected probe field 14, calibration data are also generated and stored for the second main radiation direction used during the second calibration measurement. As already mentioned, the calibration data may also be generated and stored for all probe fields 14 as shown in FIG. 1. These second calibration data are labeled by p2.

The calibration data (of both calibration measurements) provide the appropriate calibration datasets of each individual probe field 14 as shown in FIG. 1. However, calibration data of the calibration measurements may already be deemed as calibration datasets, respectively.

Once the calibration measurements are finished, the reference unit 16 is replaced by a device under test 24 in order to measure its beam steering characteristics as shown in the lower portion of FIG. 1.

Thus, the device under test 24 is located at the exactly same position as the reference unit 16 was located during the calibration measurements, namely the measurement position 20. The measurement position 20 has a predefined distance d to the probe array 12 ensuring that the distance d between the probe array 12 and the device under test 24 or rather the reference unit 16 remains the same (same relative positions).

Further, the angular behavior (angularity) is also not altered during the different measurements. Therefore, the relative position of the probe array 12 and the device under test 24 or rather the reference unit 16 is defined at least by the angles between the probe array 12 and the device under test 24 or rather the reference unit 16. In some embodiments, these angles include the azimuth angle and the elevation angle.

Once the device under test 24 is located at the measurement position 20, at least one measurement of the device under test 24 is performed by using the probe array 12, in particular the predefined number of field probes 14. In some embodiments, the same field probes 14 are used that have been used for the calibration measurements such that the calibration datasets obtained can be used in order to evaluate the device under test 24, in particular its radiation pattern or rather its beam steering characteristics.

The evaluation may take place by comparing the different measurement results appropriately in order to determine the main radiation direction R of the device under test 24.

Furthermore, two or more measurements of the device under test 24 may be performed, in particular in a similar manner as for the calibration measurements.

In some embodiments, the main radiation direction R of the device under test 24 is calculated while calculating the smallest error against the calibration datasets generated during the calibration measurements. The smallest error may be calculated by using at least one of a root means squared error (RMS), a mean absolute error, and a mean squared error.

Thus, the comparison of the different measurement results, in particular the determination of the (deviation) error, already provides a good approximation of the main radiation direction R of the device under test 24 as the field probe 14 of the probe array 12 can be determined that is located the closest to the main radiation direction R since its calibration dataset has the smallest error.

Furthermore, an interpolation of the measurement results may be performed in some embodiments in order to determine the main radiation direction R with a higher accuracy. Therefore, at least the second smallest error is also taken into account in order to determine the main radiation direction R of the device under test 24. Particularly, the second, third, fourth and so on smallest error are taken into account in order to determine the main radiation direction R of the device under test 24. The more calibration datasets are used for the interpolation, the higher the accuracy of the determination of the main radiation direction R of the device under test 24.

The smallest error already provides the best approximation regarding the main radiation direction R of the device under test 24. However, the main radiation direction R may be located in the surrounding of the field probe 14 corresponding to the calibration dataset providing the smallest error. While taking the second and third smallest error for interpolation purposes into account, it can be derived that the main radiation direction R is located closer to the field probe 14 providing the second smallest error than the field probe 14 providing the third smallest error in the surrounding of the field probe 14 providing the smallest error.

Figure 3:
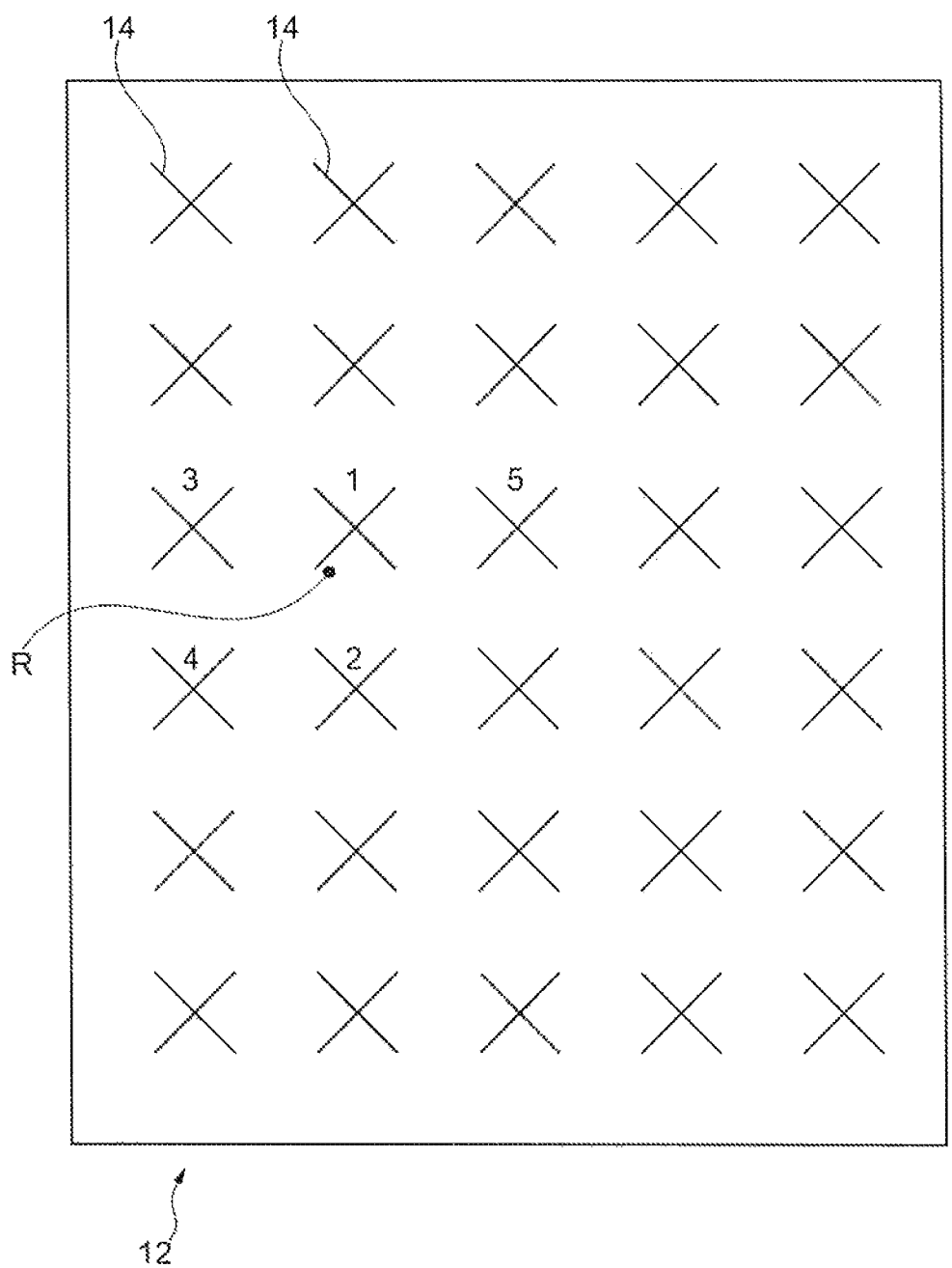
FIG. 3 shows a schematic view on a field probe.

In some embodiments, the field probes 14 surrounding the field probe 14 located closest to the main radiation direction R are taken into account as illustrated in FIG. 3 showing a probe array 12. As shown in FIG. 3, the main radiation direction R is indicated by a dot that is located close to one of the several field probes 14. This field probe 14, in particular its calibration dataset, delivers the smallest error. Therefore, it is indicated by a "1".

Usually, the output of the measurement (without interpolation) would be that the main radiation R is directed towards the field probe 14 labeled with "1". However, as the field probes 14 providing the second, third, fourth and so on smallest error are also taken into account which are labeled appropriately, the exact main radiation direction R can be determined. During this interpolation, it is determined that the main radiation direction R is located in the surrounding of the field probe 14 labeled with "1" closer to the field probe 14 labeled with "2" than the other field probes 14. Further, the main radiation direction R is located closer to the field probe 14 labeled with "3" than the field probes 14 labeled with higher numbers and so on.

Taking at least all field probes 14 into account that surround the field probe 14 labeled with "1" already provides a very good result regarding the determination of the main radiation direction R.

As already indicated, the calibration datasets of the individual field probes 14 are taken into account, in particular compared to the measurement result(s) of the measurement (s) of the device under test 24.

The control and analyzing unit 22 may include, in some embodiments, logic for implementing the technologies and methodologies described herein. This logic of the control and analyzing unit 22 can be carried out in either hardware or software, or a combination of hardware and software. In some embodiments, the control and analyzing unit 22 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the control and analyzing unit 22 includes a microprocessor and a memory storing logic modules and/or instructions. In an embodiment, the control and analyzing unit 22 includes one or more ASICs having a plurality of predefined logic components. In an embodiment, the control and analyzing unit 22 includes one or more FPGA having a plurality of programmable logic components. In an embodiment, the control and analyzing unit 22 includes hardware circuit implementations (e.g., implementations in analog circuitry, implementations in digital circuitry, and the like, and combinations thereof). In an embodiment, the control and analyzing unit 22 includes combinations of circuits and computer program products having software or firmware instructions stored on one or more computer readable memories that work together to cause a device to perform one or more methodologies or technologies described herein.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for measuring beam steering characteristics of a device under test using a measurement system, the measurement system comprising a probe array with at least two field probes, said field probes being arranged at different angles with respect to said device under test, the method comprising:
   providing a reference unit for calibrating said probe array, said reference unit positioned at a measurement position that is a distance D with respect to the probe array and configured to generate at least two radiation patterns each with a different main radiation direction;

performing at least two calibration measurements of said main radiation patterns of said reference unit, wherein a predefined number of field probes of said probe array is used for measuring said at least two radiation patterns of said reference unit;

generating a calibration dataset for at least each field probe of said predefined number of field probes and each radiation direction;

storing said calibration datasets;

replacing, after said performing at least two calibration measurements, said reference unit with said device under test such that said device under test is located at said measurement position; and performing a measurement of said device under test by using said predefined number of field probes of said probe array.

2. The method according to claim 1, wherein said probe array remains in its position.

3. The method according to claim 1, wherein the same field probes of said probe array are used for said calibration measurements and said measurement of said device under test.

4. The method according to claim 1, wherein all field probes of said probe array are used for said calibration measurements and said measurement of said device under test.

5. The method according to claim 1, wherein all calibration datasets generated are used to determine the main radiation direction of said device under test.

6. The method according to claim 5, wherein the main radiation direction of said device under test is calculated.

7. The method according to claim 5, wherein said main radiation direction is determined by calculating the smallest error against said calibration datasets generated.

8. The method according to claim 7, wherein said smallest error is calculated by taking said calibration datasets of said predefined number of field probes into account.

9. The method according to claim 7, wherein said smallest error is calculated by using at least one of a root means squared error, a mean absolute error, and a mean squared error.

10. The method according to claim 5, wherein an interpolation of the measurement results is performed based on said calibration datasets such that at least the second smallest error is also taken into account in order to determine said main radiation direction of said device under test.

11. The method according to claim 10, wherein said interpolation is performed by taking all calibration datasets of said predefined number of field probes into account.

12. The method according to claim 5, wherein an interpolation of the measurement results is performed based on said calibration datasets of the field probes surrounding said field probe located closest to the main radiation direction determined.

13. The method according to claim 1, wherein the position of said probe array with respect to said device under test or said reference unit is defined at least by the azimuth angle and the elevation angle.

14. The method according to claim 1, wherein said reference unit is a reference antenna.

* * * * *